United States Patent
Fujii et al.

[11] Patent Number: 6,135,052
[45] Date of Patent: Oct. 24, 2000

[54] METHOD AND APPARATUS FOR TEMPERATURE CONTROL OF THE SEMICONDUCTOR

[75] Inventors: Hitoshi Fujii, Miyagi; Shinsuke Hirano, Kanagawa, both of Japan

[73] Assignee: Sony Corporation, Tokyo, Japan

[21] Appl. No.: 09/031,301

[22] Filed: Feb. 26, 1998

Related U.S. Application Data

[62] Division of application No. 08/766,044, Dec. 13, 1996, abandoned.

[30] Foreign Application Priority Data

Dec. 15, 1995 [JP] Japan .................................. 7-348085

[51] Int. Cl.[7] .................................................. C23C 16/509
[52] U.S. Cl. .................................. 118/723 E; 118/723 I; 118/723 R
[58] Field of Search ........................ 156/643, 345; 219/390; 29/825; 266/190; 204/298.25; 118/723 I; 438/710; 251/193

[56] References Cited

U.S. PATENT DOCUMENTS

| | | | |
|---|---|---|---|
| 4,313,783 | 2/1982 | Davies et al. ......................... | 156/643 |
| 4,455,017 | 6/1984 | Wunsche ............................... | 266/190 |
| 4,798,650 | 1/1989 | Nakamura et al. ..................... | 156/643 |
| 5,356,515 | 10/1994 | Tahara et al. ......................... | 156/643 |
| 5,556,500 | 9/1996 | Hasegawa et al. ..................... | 156/345 |
| 5,581,874 | 12/1996 | Aoki et al. ............................. | 29/825 |
| 5,683,072 | 11/1997 | Ohmi et al. ............................ | 251/193 |
| 5,683,561 | 11/1997 | Hollars et al. ....................... | 204/298.25 |
| 5,753,891 | 5/1998 | Iwata et al. ........................... | 219/390 |
| 5,783,492 | 7/1998 | Higuchi et al. ........................ | 438/710 |
| 5,792,261 | 8/1998 | Hama et al. ........................... | 118/723 I |

OTHER PUBLICATIONS

S. Thomas III, et al, "In Situ fiber optic thermometry of wafer etched with an electron cyclotron resonance source", J.Vac. Sci. Tech.B 14(3), Nov. 1995.

*Primary Examiner*—Marian C. Knode
*Assistant Examiner*—Rudy Zervigon
*Attorney, Agent, or Firm*—Hill & Simpson

[57] ABSTRACT

In a wafer temperature control method and a wafer temperature control device with which it is possible to raise the stability of the temperature of a wafer in a semiconductor manufacturing apparatus and the responsiveness of the temperature of the wafer to changes in a set wafer temperature and thereby obtain a higher quality product, the temperature of the wafer is controlled by both the flowrate of a coolant and the heat output of a heat source being controlled.

1 Claim, 3 Drawing Sheets

METHOD AND APPARATUS FOR TEMPERATURE CONTROL OF THE SEMICONDUCTOR

This application is a division of 08/766,044 filed Dec. 13, 1996 now abandoned.

BACKGROUND OF THE INVENTION

1. Field of the Invention

This invention relates to a method and apparatus for controlling the temperature of a semiconductor wafer in a semiconductor manufacturing apparatus, and particularly to a wafer temperature control method and a wafer temperature control device which in a manufacturing process carried out inside a semiconductor manufacturing apparatus such as an etching apparatus for processing a wafer at a low temperature keep the temperature of the wafer at a set temperature with high accuracy and improve responsiveness of the temperature of the wafer to changes in the set temperature.

2. Description of the Related Art

In present semiconductor technology, improvement of manufacturing process technology is indispensable for the realization of greater integration, greater density of integration and higher performance of devices. In particular, in a dry etching apparatus used for a fine manufacturing process, to carry out highly anisotropic etching, control maintaining the temperature of a wafer at an extremely low temperature (−70° C. or below) with high accuracy during the process is necessary. That is, it is necessary to carry out etching in an extremely low temperature state in order to control etching rate and selection ratio with high accuracy. Also, as semiconductor devices are made smaller, pattern densities and contact hole aspect ratios become larger, and it is necessary to achieve increased etching accuracy by carrying out highly anisotropic etching. An extremely low temperature state is necessary to achieve this high anisotropy.

As an example of extremely low temperature etching, the content of a presentation given by K. Tsujimoto et al. in 1988 is included in Proceedings of Symposium on Dry Processes (Oct. 24–25, 1988, Tokyo), pp. 42–49.

However, with this method, because the temperature controllability is poor, returning a wafer having been brought to a low temperature to room temperature takes a long time. Consequently, using an apparatus based on this method for production has been problematic. Furthermore, the method also left unresolved problems of set temperature stability.

An apparatus conceived to solve this problem is shown in FIG. 1.

In this apparatus, a wafer 70 is placed on a lower electrode 63 inside a vacuum chamber 61 and a manufacturing process is carried out in a plasma atmosphere while the wafer 70 is cooled by way of the lower electrode 63 by liquid nitrogen or freon gas or the like sent from a refrigerating machine 64 through a pipe 71. In this case, temperature control keeping the wafer 70 at an extremely low temperature is carried out by a signal from a sensor 66 detecting the temperature of the lower electrode 63 being inputted into a control box 72 and the opening angles of a main valve 51 and a bypass valve 52 disposed in the pipe 71 being controlled with commands from the control box 72 and the flow quantity of the coolant thereby being controlled.

However, because temperature control of the coolant itself is difficult, wafer temperature control in the related art semiconductor manufacturing apparatus described above has been performed by means of feedback control of the coolant flowrate, and when the temperature of the wafer 70 has fallen below a set temperature (target value) at a time of plasma stoppage or due to an outside disturbance it has taken time to return to the set temperature. Furthermore, the responsiveness to changes in the set temperature has also been bad. Explaining this more specifically, related art wafer temperature control has been carried out just by controlling the coolant flowrate, and no heat source has been provided. Therefore, as shown in FIG. 3, although when the wafer has risen in temperature when a plasma is impressed it has been possible to suppress the temperature rise to a certain extent by increasing the opening angle of the main valve 51 and thereby increasing the flowrate of coolant to the lower electrode 63, when the wafer has fallen in temperature at a time of plasma stoppage or due to an outside disturbance the only method of returning it to the set temperature has been to close the main valve 51 and open the bypass valve 52 and stop the cooling of the wafer 70 on the electrode by the coolant. Consequently, it has taken time for the wafer to return to the set temperature which is the target value.

Also, during a process the temperature of the wafer 70 is reduced to an extremely low temperature of about −100° C. and furthermore, because the inside of the vacuum chamber 61 is a vacuum, once the wafer 70 is reduced to an extremely low temperature this temperature is maintained by vacuum insulation. Consequently, over half a day has been required for the operation of returning the wafer from −100° C. to room temperature after the completion of wafer processing.

Because the stability of the wafer temperature and the responsiveness to changes in the set temperature of related art wafer temperature control have thus been poor, satisfactory control of the above-mentioned high anisotropy of etching has not been achieved and consequently it has not been possible to perform a fine etching process with high accuracy and it has not been possible to obtain a high quality product.

OBJECT AND SUMMARY OF THE INVENTION

It is therefore an object of the invention to provide a method and apparatus for controlling the temperature of a semiconductor wafer in a semiconductor manufacturing apparatus with which it is possible to raise the stability of the wafer temperature and the responsiveness of the wafer temperature to changes in the set temperature and thereby obtain a higher quality product.

To achieve the above-mentioned object, the invention provides a method for controlling the temperature of a semiconductor wafer in a semiconductor manufacturing apparatus for processing a wafer in a chamber, which method comprises controlling the flowrate of a coolant and controlling the heat output of a heat source.

In a specific aspect of the invention, the chamber contains a plasma atmosphere, the wafer is placed on an electrode, the temperature of the wafer on the electrode is detected by an optical fiber thermometer and the flowrate of the coolant and the heat output of the heat source are controlled on the basis of a detection signal from the optical fiber thermometer.

In another specific aspect of the invention, the method is used to control the temperature of a wafer being processed by etching.

In another specific aspect of the invention, when the set wafer temperature is increased the coolant is cut off and the heat output of the heat source is controlled to bring the wafer to the new set temperature.

The invention also provides a wafer temperature control device of a semiconductor manufacturing apparatus, which wafer temperature control device comprises an electrode which supports a wafer, a chamber containing the electrode, cooling means for cooling the electrode and heating means for heating the electrode.

Preferably, vacuum gas discharging means is connected to the chamber, plasma generating means is disposed inside the chamber and an optical fiber thermometer for detecting the temperature of a wafer is fitted to the electrode.

With a temperature control method according to the invention as described above, when the temperature of the wafer is lower than the set temperature, flowrate control of the coolant is stopped and cooling of the wafer is stopped and the heat output of the heat source is controlled so that the wafer is heated to the set wafer temperature; consequently, compared to related art technology wherein wafer temperature control is carried out by means of flowrate control of a coolant only, it is possible to raise the stability of the wafer temperature and the responsiveness of the actual wafer temperature to changes in the set wafer temperature.

Also, in this invention, because wafer temperature control is carried out by both controlling the flowrate of a coolant and controlling the heat output of a heat source, it is possible to bring a wafer to a set temperature swiftly and it is possible to hold the wafer at this set temperature stably. Furthermore, compared to a case wherein only coolant flowrate control is carried out it is possible to carry out finer adjustment of the temperature of the wafer by means of control of the heat output of the heat source and therefore highly anisotropic etching can be carried out with high accuracy and it is possible to provide a high quality product with finely etched patterns.

Also, by operating the heat source after completion of a process, compared to related art technology wherein no heat source is used it is possible to bring the wafer to a new set temperature or to room temperature more swiftly and the operation rate of the apparatus increases and productivity can be raised.

DETAILED DESCRIPTION OF THE PREFERRED EMBODIMENTS

Figure 1:
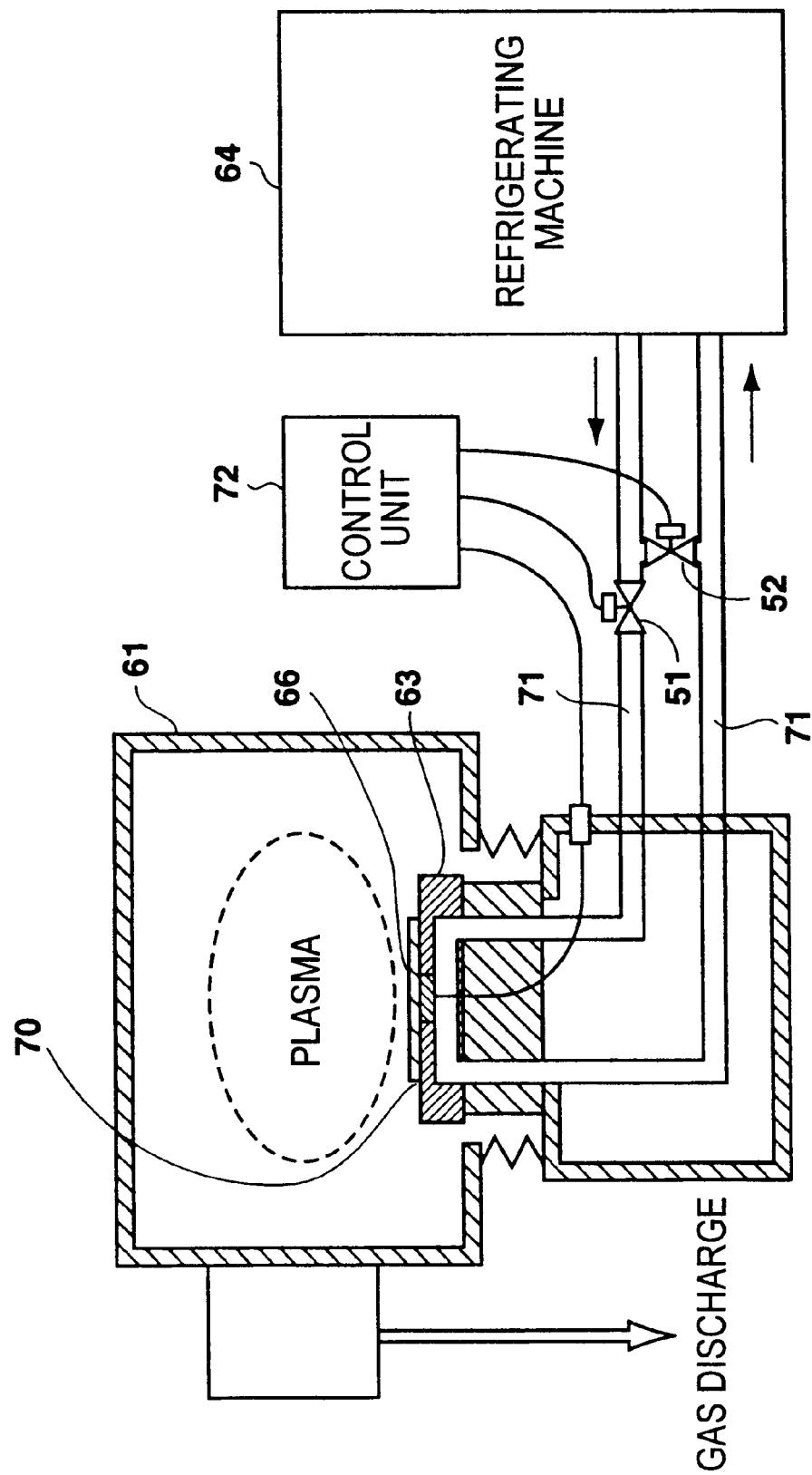
FIG. 1 is a schematic view of a wafer temperature control device of the related art.
Figure 2:
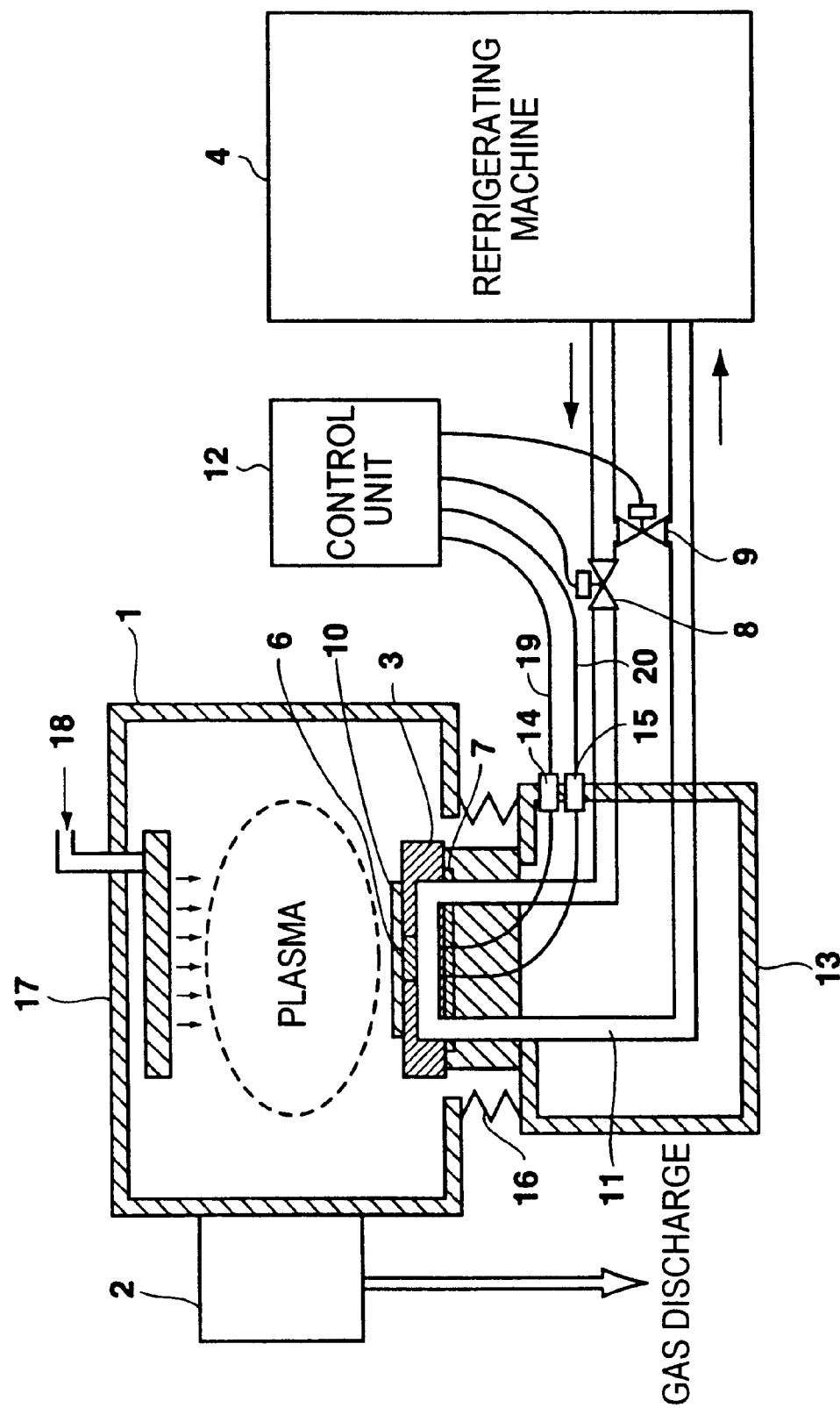
FIG. 2 is a schematic view of an apparatus for practicing a wafer temperature control method according to the invention.

FIG. 2 is a schematic view showing an example of a wafer temperature control device according to the invention in a plasma etching apparatus.

A chamber 1 which is a reaction vessel for carrying out an etching process has inside it an upper electrode 17 and a lower electrode 3 facing the upper electrode 17. A reaction gas supply pipe 18 is connected to the upper electrode 17. The lower electrode 3 serves as a support table for supporting a wafer 10 being processed. A gas discharging apparatus 2 is connected to the chamber 1 and creates a vacuum inside the chamber 1 during the process and purges the reaction gas after the process. By means of this construction, during a process, a wafer 10 is placed on the lower electrode 3, a high frequency bias is impressed across the two electrodes in a vacuum atmosphere and as a result the reaction gas is ionized and becomes a plasma.

A coolant pipe 11 constituting a part of cooling means passes through the lower electrode 3, and a ceramic heater 7 constituting heating means and a fluorescence type optical fiber thermometer 6 are also disposed in the lower electrode 3.

The coolant pipe 11 is connected by way of a main valve 8 and a bypass valve 9 to a refrigerating machine 4 which circulates a coolant such as liquid nitrogen or freon gas.

The optical fiber thermometer 6 radiates pulse light from a xenon lamp onto a fluorescent substance constituting a detecting element and detects the temperature of the detecting element by detecting a remaining light intensity corresponding to its temperature. The reason for using this kind of optical fiber thermometer 6 is that it is possible to detect temperature accurately without suffering an influence of noise arising when a plasma is impressed.

This optical fiber thermometer 6 is embedded in the lower electrode 3 and the detecting element (the fluorescent substance) thereof is exposed at the electrode surface. Thus, in this example the temperature of the wafer 10 placed on the lower electrode 3 is detected directly. This detecting end part is connected by way of an optical fiber 19 to a control unit 12. A photoelectric convertor is provided inside the control unit 12 and converts the light intensity corresponding to the temperature into a voltage.

A main valve 8 and a bypass valve 9 in the coolant pipe 11 are also connected to the control unit 12, and in correspondence with the temperature of the wafer 10 the opening angles of the main valve 8 and the bypass valve 9 are regulated and the flowrate of the coolant is thereby controlled. Also, the ceramic heater 7 is connected to the control unit 12 and the heat output of this ceramic heater 7 is controlled according to the detected temperature of the wafer and the set temperature.

With this construction, the ceramic heater 7, the main valve 8 and the bypass valve 9 can be feedback controlled on the basis of a detected temperature from the optical fiber thermometer 6 by means of the control unit 12 with a set temperature of a wafer process as a target value.

The lower electrode 3 is vertically movable for wafer placement and removal, and also is supported on a vacuum chamber 13 to prevent freezing by the coolant. This vacuum chamber 13 and the chamber 1, which is a reaction chamber, are connected by way of sealing bellows 16.

Also, the optical fiber 19 of the optical fiber thermometer 6 and a cable 20 of the ceramic heater 7 pass through vacuum seals 14, 15 in a side wall of the vacuum chamber 13.

With a wafer temperature control device of this construction, during a process, the wafer 10 is cooled by way of the lower electrode 3 by the coolant passing through the inside of the coolant pipe 11 and the wafer 10 is heated by the ceramic heater 7 by way of the lower electrode 3 so that the temperature of the wafer 10 does not fall too far, and the flowrate of the coolant and the heat output of the ceramic heater 7 are controlled by the control unit 12, which inputs the temperature of the wafer 10 from the optical fiber thermometer 6, and the wafer 10 is thereby stably held at the set temperature.

Figure 3:
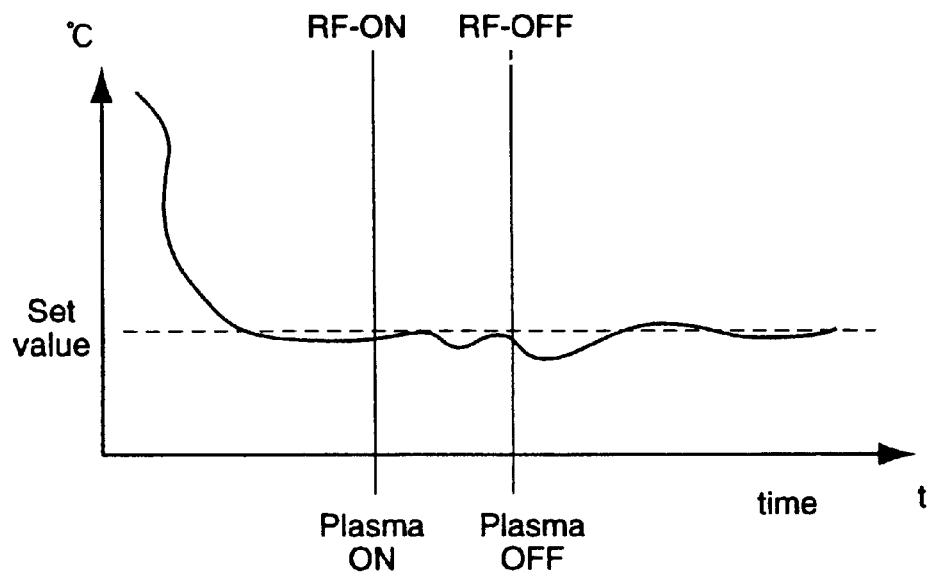
FIG. 3 is a graph showing a wafer temperature control characteristic of a wafer temperature control device of the related art.
Figure 4:
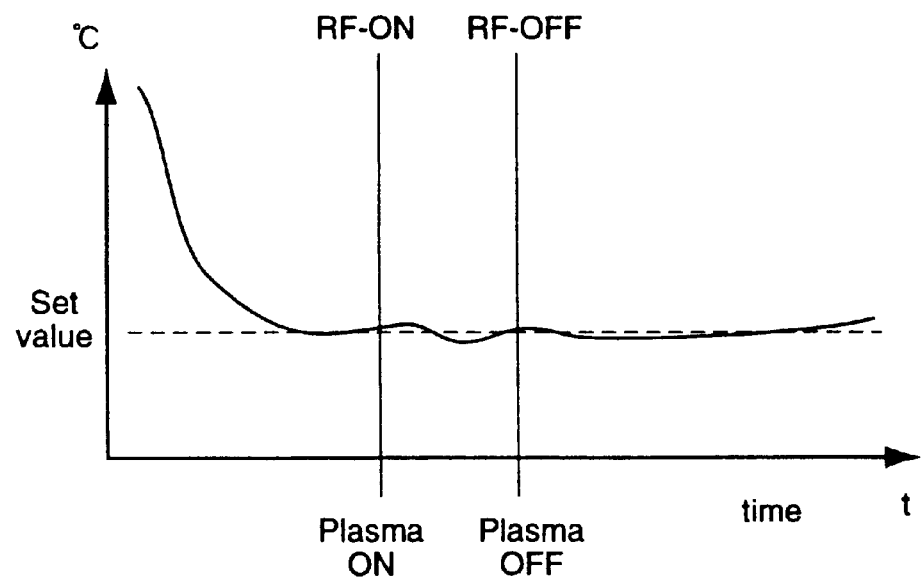
FIG. 4 is a graph showing a wafer temperature control characteristic of an apparatus according to the invention.

FIG. 4 is a graph of a temperature control characteristic in a wafer temperature control device of the construction described above. As can be seen from FIG. 4, in this invention, compared, to the related art example shown in FIG. 3, the set temperature is more stably maintained. That is, temperature changes resulting from temperature increases at times of plasma impression (ON) and temperature decreases at times of plasma stoppage (OFF) and temperature changes resulting from outside disturbances at times of pressure change and other state changes are adjusted by flowrate control of the coolant and heat output control of the ceramic heater 7 by the control unit 12, and compared to related art temperature control using coolant flowrate control only the wafer 10 is held more stably at the set temperature.

Also, when after completion of a process the temperature of the wafer 10 is down at an extremely low temperature of about −100° C. and the inside of the chamber 1 is a vacuum, with this wafer temperature control device, by operating the ceramic heater 7 by means of the control unit 12, the inside of the chamber and the wafer can be returned to room temperature swiftly.

In the embodiment described above, the ceramic heater 7 was used as the heating means and the optical fiber thermometer 6 was used as the thermometer, but the invention is not limited to this.

What is claimed is:

1. A semiconductor manufacturing apparatus comprising:

an evacuatable plasma processing chamber comprising a reaction chamber disposed vertically above a vacuum chamber, the reaction chamber being connected to the vacuum chamber by sealing bellows;

a lower block electrode disposed in said reaction chamber having an upper surface including an optical fiber thermometer disposed in a central portion of the upper surface and positioned to make direct contact with a semiconductor wafer placed on the upper surface for etching or other plasma processing, the lower electrode being supported by an open end of the vacuum chamber;

an upper electrode disposed in the reaction chamber and vertically above the lower electrode and facing the lower electrode, the upper electrode being connected to a reaction gas supply pipe;

a coolant flow circuit including a coolant flow pipe passing through the lower block electrode and through the vacuum chamber and fluidly connected to a flowable source of refrigerated coolant, an electrically controlled flow control valve disposed in said flow pipe and an electronically controlled by-pass valve extending across supply and return portions of said flow pipe;

an electronically controlled ceramic heater disposed against the block electrode opposite the upper surface; and an electronic controller operably connected to said thermometer, flow control valve, by-pass valve and heater, said electronic controller maintaining a desired wafer temperature for processing by opening or closing the flow control valve and by-pass valve and by turning on and off the ceramic heater, as may be required, in response to a temperature of a wafer detected by said thermometer, whereby a wafer processing temperature with improved stability is provided and an improved response to changes in set temperature is provided thereby providing an improved quality product.

* * * * *